United States Patent

Kirkland et al.

[11] Patent Number: 5,789,813
[45] Date of Patent: Aug. 4, 1998

[54] BALL GRID ARRAY PACKAGE WITH INEXPENSIVE THREADED SECURE LOCKING MECHANISM TO ALLOW REMOVAL OF A THREADED HEAT SINK THEREFROM

[75] Inventors: Janet Kirkland, Fremont; Mark R. Schneider, San Jose, both of Calif.

[73] Assignee: LSI Logic Corporation, Milpitas, Calif.

[21] Appl. No.: 724,076

[22] Filed: Sep. 30, 1996

[51] Int. Cl.⁶ ............ H01L 23/28; H01L 23/10; H01L 23/48; H01L 39/02
[52] U.S. Cl. ............ 257/712; 257/719; 257/738; 257/780; 257/796; 257/789; 257/790
[58] Field of Search .............. 257/712, 719, 257/718, 726, 727, 778, 737, 738, 790, 796, 707, 706, 780, 785, 789, 788

[56] References Cited

U.S. PATENT DOCUMENTS

| | | | |
|---|---|---|---|
| 4,612,978 | 9/1986 | Cutchaw | 257/714 |
| 4,748,495 | 5/1988 | Kucharek | 257/672 |
| 4,884,169 | 11/1989 | Cutchaw | 257/713 |
| 5,227,663 | 7/1993 | Patil et al. | 257/706 |
| 5,285,352 | 2/1994 | Pastore et al. | 257/700 |
| 5,293,930 | 3/1994 | Pitasi | 165/80.3 |
| 5,311,060 | 5/1994 | Rostoker et al. | 257/796 |
| 5,355,283 | 10/1994 | Marrs et al. | 257/687 |
| 5,386,342 | 1/1995 | Rostoker | 257/790 |
| 5,397,919 | 3/1995 | Tata et al. | 257/719 |
| 5,525,835 | 6/1996 | Nishiguchi | 257/712 |
| 5,528,159 | 6/1996 | Charlton et al. | 327/758 |
| 5,610,442 | 3/1997 | Schneider et al. | 257/778 |
| 5,619,070 | 4/1997 | Kozono | 257/738 |

*Primary Examiner*—Tom Thomas
*Assistant Examiner*—Alexander Oscar Williams
*Attorney, Agent, or Firm*—Oppenheimer Poms Smith

[57] ABSTRACT

An integrated circuit package having a die supported on a ball grid array substrate and wire bonds electrically connecting the die to the substrate. Supported on the substrate is a lock ring having a threaded opening encircling the die. Encapsulant covers the die and the wire bonds and adheres the lock ring to the substrate. A heat sink having a threaded portion can be threaded into the lock ring into an operative cooling position relative to the die and subsequently to an unthreaded removed position. When in the latter position, a repair station can be positioned over the package and the solder balls are accessible for hot gas melting thereof for removal (or replacement) of the package from the underlying motherboard.

27 Claims, 3 Drawing Sheets

5,789,813

BALL GRID ARRAY PACKAGE WITH INEXPENSIVE THREADED SECURE LOCKING MECHANISM TO ALLOW REMOVAL OF A THREADED HEAT SINK THEREFROM

BACKGROUND OF THE INVENTION

The present invention is directed to constructions of ball grid array (BGA) packages having heat sinks and to methods for removing those packages from printed circuit boards or motherboards for repair or replacement.

A BGA is a packaged integrated circuit in which one or more integrated circuit chips (semiconductor dies on which electrically conductive circuitry are formed) are mounted on a (top) surface of a substrate, and an electrical connection to electrically conductive material not part of the packaged integrated circuit, such as a printed circuit board, is made by an array of solder balls located on a (bottom) surface of the substrate opposite the surface to which the integrated circuit chip or chips are attached. Passive components such as resistors or capacitors can also be mounted on the top surface of the substrate. The substrate can be a multi-layer substrate, electrically conductive traces and/or regions being formed on a surface of each layer of the substrate. The integrated circuit chip or chips and the passive components are typically encapsulated by, for instance, plastic to protect them from the external environment. The integrated circuit chip or chips are electrically connected to the substrate by wire bonding or by tape-automated bonding (TAB), or flip-chip interconnection.

BGAs allow a higher density of external chip connections to be made than do other packaged integrated circuits having leads extending from the package. An example of a BGA package is shown in U.S. Pat. No. 5,355,283 (Marrs, et al.).

Heat is inevitably generated during the operation of integrated circuit devices, such as BGAs. In some instances, the amount of heat generated can be sufficient to irreparably damage or even destroy the device. Continuing advances in the number of transistors and other functional elements contained in a single integrated circuit, and the increasingly high speeds at which integrated circuits now operate, both contribute to the problem of integrated circuit heat dissipation. The heat can be so great that some devices require that a powered fan be incorporated on them to prevent their failure; an example is the Pentium chip available from Intel Corp. and which is sometimes sold with a small fan mounted on the component itself.

It is generally well known to provide some sort of heat sink for semiconductor devices to remove and dissipate the heat. A variety of methods and devices have been developed for removing at least some of the heat from integrated circuit devices. Typically a unitary heat sink structure has been used. Heat sinks generally include at least a heat-transferring portion proximate to the semiconductor device for extracting heat therefrom, and a heat-dissipating portion remote from the die with a large surface area for dissipating heat. The heat-dissipating portion is typically formed with a number of parallel layers, through which air passes to remove heat from the heat sink. Typically, the entire heat sink structure may simply be disposed on an exterior of a package, such as on the lid of a lidded package.

The heat sinks are typically attached to the package with epoxy. However, this renders them vulnerable to being impacted and torn away. Also, they cannot be easily removed from the package. Additionally, when attached, repair stations cannot be fitted over them to allow hot nitrogen gas to reflow the solder balls. This prevents defective packages from being removed from motherboards for repair or replacement.

Other types of heat sink securements are known, as shown in U.S. Pat. Nos. 5,227,663 (Patil, et al.) and 5,293,930 (Pitasi). A further example is a threaded heat sink attachment available from Vemaline Products of Warwick, R.I. This attachment provides that the heat sink is threaded into a small clip-on device. This device is made of plastic and is clipped over the sides of the printed circuit board. However, this device does not work well, since it falls off easily.

SUMMARY OF THE INVENTION

Directed to remedying the problems in the prior art, disclosed herein is an improved BGA package having a die mounted on and wire-bonded to a substrate. The package has a threaded lock ring encircling the die. Encapsulant protectively covering the die and the wire bonds also secures the lock ring directly to the substrate. The lock ring, for example, can be an inexpensive commercially-available electric box lock nut. When the nut is secured to the substrate, the threaded female opening encircles the die (and wire bonds). A heat sink having a threaded male portion can be screwed into the female opening and into an operative position for cooling the die.

The package is secured via the BGA under the substrate to a printed circuit board or motherboard. When the package is damaged or otherwise is needed to be removed from the motherboard, removal (unlike the prior art packages) is easy pursuant to this invention. The heat sink is simply unthreaded from the lock ring and removed. The underlying package is thereby accessible so that a repair station can be effectively positioned thereover and hot gases efficiently directed to the solder balls. The solder balls are melted or reflowed and the package removed off of the board.

Other objects and advantages of the present invention will become more apparent to those persons having ordinary skill in the art to which the present invention pertains from the foregoing description taken in conjunction with the accompanying drawings.

DETAILED DESCRIPTION OF PREFERRED EMBODIMENTS OF THE INVENTION

Figure 1:
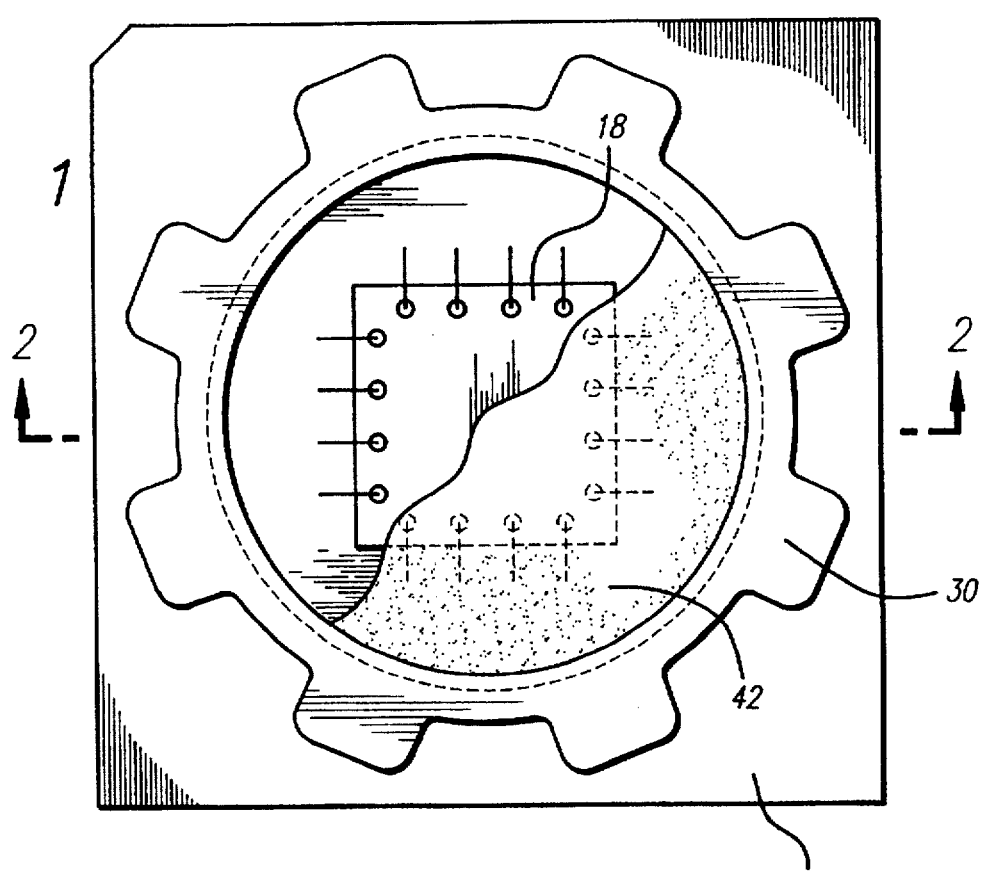
FIG. 1 is a top plan view of a BGA package of the present invention without a heat sink and with portions thereof broken away for illustrative purposes.

Referring to the drawings, an integrated circuit package of the present invention is illustrated generally at 10. Package 10 includes a BGA substrate 14. An integrated circuit die or chip 18 is mounted on the substrate 14 and electrically connected thereto by wire bonds 26. A lock ring 30 is attached to the top of the substrate 14 with Loctite or other adhesive 34. It is attached with the threaded opening 38 thereof surrounding the die 18. The threaded opening 38 is preferably a one-inch pipe thread. Hysol encapsulant 42 is poured into the opening to cover the die 18 and wire bonds 26. The encapsulant 42 when cured thereby also secures the lock ring 30 to the substrate 14.

The lock ring 30 can be an electrical box lock nut cast of white metal. They are commercially available retail and are very inexpensive, perhaps ten cents apiece. In large wholesale volumes, the lock nuts would likely cost no more than five cents each.

Thus, steps of a preferred method of constructing the package 10 are as follows:

(1) a die 18 is attached to a BGA substrate 14 or more particularly an EPBGA substrate;

(2) the die is electrically connected to the substrate with wire bonds 26;

(3) a threaded lock ring 30 is positioned on the substrate 14 using a light application of Loctite adhesive 34 to the substrate; and (4) the threaded opening 38 is filled with HYSOL encapsulant to completely cover the wire bonds and the die.

Figure 2:
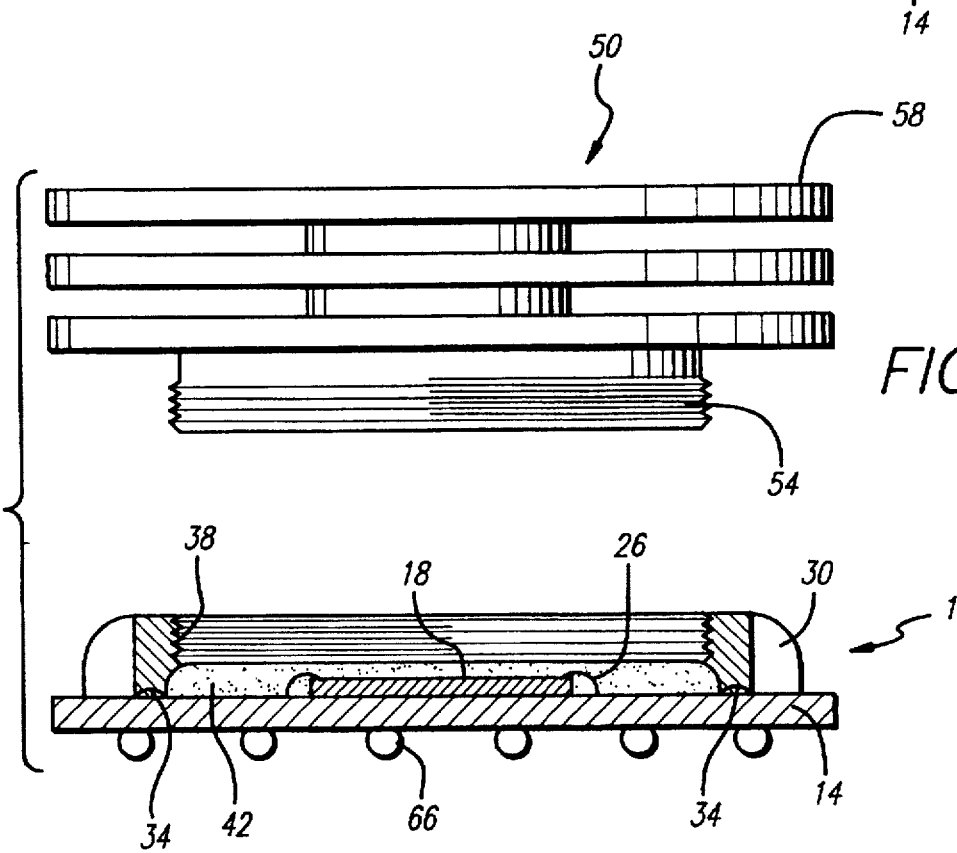
FIG. 2 is a cross-sectional view of the package of FIG. 1 taken on line 2—2 and illustrated with a heat sink.
Figure 3:
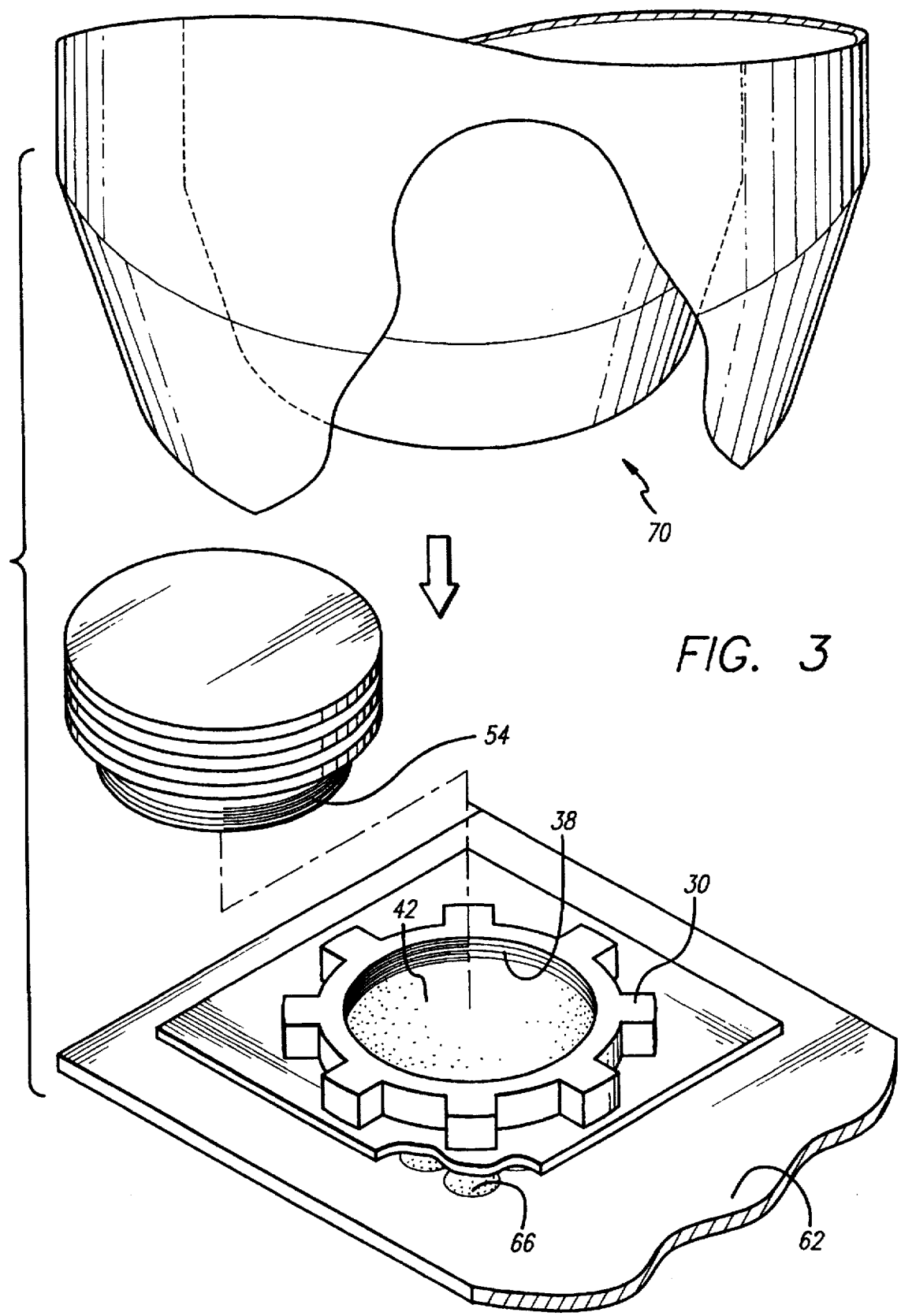
FIG. 3 is a fragmentary perspective view of the package of FIG. 1 mounted on an underlying motherboard with the heat sink shown unthreaded and removed therefrom and a repair station being positioned thereover, the repair station having portions thereof broken away for illustrative purposes.

After the encapsulant 42 has cured, a threaded heat sink 50, as shown in FIGS. 2 and 3, can be screwed into the threaded opening 38. The heat sink 50 has a male threaded portion 54 and horizontal fins 58 secured thereon. An example of a preferred threaded heat sink 50 is that available from Vemaline Products.

The package 10 is attached to a printed circuit board or motherboard 62 by reflowing the solder balls 66 of the BGA substrate 14. The securement of the package 10 to the motherboard 62 is shown in FIG. 3. The heat sink 50 can be threaded into a secure position in the threaded opening 38 before or preferably after the package 10 is secured to the motherboard 62, as shown in FIG. 3.

Figure 4:
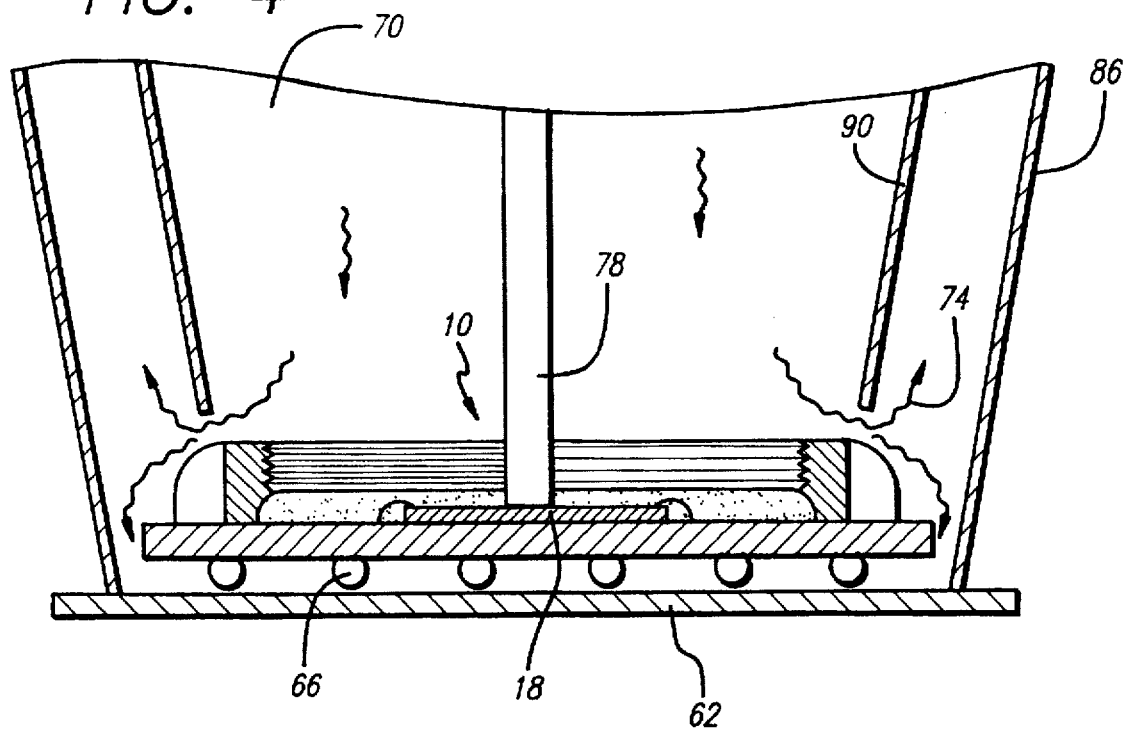
FIG. 4 is a cross-sectional view showing the package with the repair station of FIG. 3 positioned thereover in a die removal process.
Figure 5:
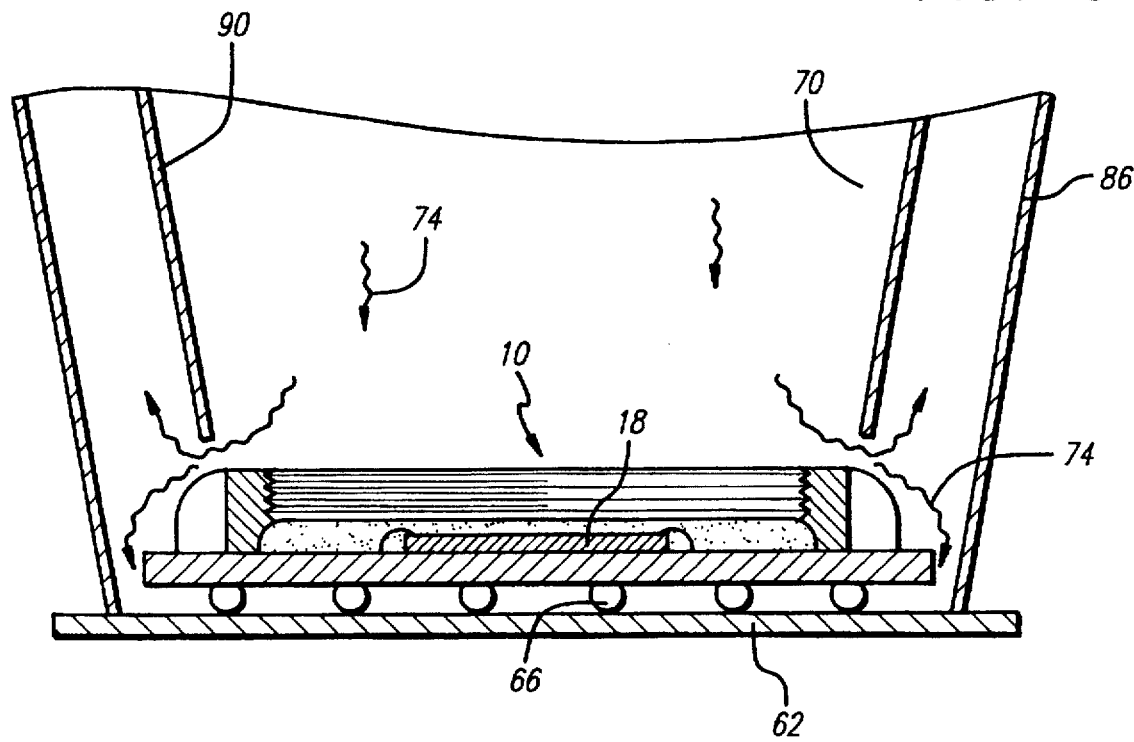
FIG. 5 is a view similar to FIG. 4 showing a die replacement process of the invention.

Should the package 10, or more particularly the die 18, be or become defective, the present invention allows for easy removal from the motherboard 62 for replacement or removal (for repair), as can be understood from FIGS. 3–5. First the heat sink 50 is unthreaded from the threaded opening 38 and removed from the package 10. The repair station 70 is then positioned securely over the package 10, and hot nitrogen gas 74 is pumped in and directed to the solder balls 66. With the solder balls 66 melted or reflowed, the package 10 can be removed from the motherboard 62. The heat sink 50 can be threaded on and off as many times as needed.

FIG. 4 shows the repair station 70 in position in a component (package 10 or die 18) removal process. Since the heat sink 50 has been removed, the vacuum tube 78 can efficiently access the component. Thereby a suction removal pressure applied thereto by the tube 78 and with the solder balls melted by the hot air as shown by the squiggly arrows 74 allows removal of the component off of the board 62. The outer nozzle 86 prevents neighboring components on the board 62 from being heated. The repair station inner nozzle 90 helps form desirable hot air flow paths.

To secure a new package 10 on the board 62, the package is positioned at the desired location on the board with the solder balls 66 thereagainst. The repair station 70 is positioned over it, and the hot air 74 injected down and around and under to heat and reflow the solder balls 66, thereby mounting the package 10 to the board. The nozzles 86, 90 of the repair station 70 efficiently direct the hot air to the solder balls 66 without heating adjacent components.

Thus, the present invention provides a secure locking mechanism for attaching a threaded heat sink 50 to the top of an EPBGA package 10. The package 10 is very inexpensive. It also allows the customer end user the ability to remove and/or replace at their discretion the defective component for repair or replacement. This is accomplished by building into the package 10 an inexpensive lock ring 30, which can be easily adhered to the substrate 14 by the encapsulant 42 covering the wire bonds 26.

From the foregoing detailed description, it will be evident that there are a number of changes, adaptations and modifications of the present invention which come within the province of those skilled in the art. However, it is intended that all such variations not departing from the spirit of the invention be considered as within the scope thereof as limited solely by the claims appended hereto.

What is claimed is:

1. An integrated circuit package, comprising:
   a ball grid array substrate;
   an integrated circuit die on said substrate;
   a lock ring having a threaded opening, which surrounds said die, said lock ring is supported by said substrate;
   encapsulant covering said die; and
   a heat sink having a threaded portion configured to thread into said threaded opening into an operative cooling position for said die and to unthread into a removed position.

2. The package of claim 1 further comprising wire bonds electrically connecting said die to said substrate, and said encapsulant covering said wire bonds.

3. The package of claim 1 wherein said encapsulant adheres said lock ring to said substrate.

4. The package of claim 1 wherein with said heat sink in the removed position, operative access is provided to solder balls of said ball grid array substrate for heating same for removal of said substrate from an underlying board.

5. The package of claim 4 wherein the board is a printed circuit board.

6. The package of claim 1 wherein said lock ring comprises an electric-box lock nut.

7. The package of claim 1 wherein said encapsulant comprises HYSOL encapsulant.

8. The package of claim 1 wherein said lock ring comprises a cast metal lock nut.

9. The package of claim 1 wherein said heat sink includes parallel cooling fins disposed perpendicular to a longitudinal axis of said threaded portion.

10. The package of claim 1 further comprising adhesive between said lock ring and said substrate to position said lock ring for application of said encapsulant.

11. The package of claim 1 wherein said lock ring is affixed directly to said substrate.

12. An integrated circuit package, comprising:
   a substrate;
   an integrated circuit die on said substrate; and
   a lock ring affixed to said substrate, said lock ring having a threaded opening encircling said die and into which a threaded heat sink can be threaded into an operative position for cooling said die and subsequently unthreaded therefrom into a removed position relative to said package.

13. The package of claim 12 further comprising encapsulant covering said die.

14. The package of claim 13 wherein said encapsulant secures said lock ring to said substrate.

15. The package of claim 13 further comprising wire bonds electrically connecting said die to said substrate, and said encapsulant covering said wire bonds.

16. The package of claim 12 wherein said substrate comprises a ball grid array substrate.

17. The package of claim 1 wherein said lock ring is embedded in said encapsulant.

18. The package of claim 1 wherein said encapsulant coats wire bonds which electrically connect said die to said substrate.

19. The package of claim 1 wherein said encapsulant is positioned in said lock ring generally in said threaded opening.

20. The package of claim 1 wherein said encapsulant after hardening secures said lock ring to said substrate.

21. The package of claim 20 wherein said encapsulant when hardened is disposed within said lock ring.

22. The package of claim 12 wherein said lock ring is secured to said substrate by encapsulant.

23. The package of claim 22 wherein said encapsulant is disposed in said lock ring.

24. The package of claim 22 wherein said encapsulant coats and completely covers said die.

25. The package of claim 22 wherein said encapsulant coats wire bonds which electrically connect said die to said substrate.

26. The package of claim 22 wherein adhesive secures said lock ring to said substrate before said encapsulant is applied.

27. The package of claim 12 wherein said lock ring is a lock nut.

* * * * *